(12) United States Patent
Dallmann et al.

(10) Patent No.: US 8,872,341 B2
(45) Date of Patent: Oct. 28, 2014

(54) SEMICONDUCTOR STRUCTURE HAVING METAL OXIDE OR NIRTRIDE PASSIVATION LAYER ON FILL LAYER AND METHOD FOR MAKING SAME

(75) Inventors: Gerald Dallmann, Dresden (DE); Heike Rosslau, Langebrueck (DE); Norbert Urbansky, Dresden (DE); Scott Wallace, Mortizburg (DE)

(73) Assignee: Infineon Technologies AG, Neubiberg (DE)

( * ) Notice: Subject to any disclaimer, the term of this patent is extended or adjusted under 35 U.S.C. 154(b) by 591 days.

(21) Appl. No.: 12/892,947

(22) Filed: Sep. 29, 2010

(65) Prior Publication Data

US 2012/0074573 A1 Mar. 29, 2012

(51) Int. Cl.
*H01L 23/48* (2006.01)
*H01L 23/52* (2006.01)
(Continued)

(52) U.S. Cl.
CPC . *H01L 23/53238* (2013.01); *H01L 2924/01024* (2013.01); *H01L 2924/01006* (2013.01); *H01L 2224/05558* (2013.01); *H01L 23/53223* (2013.01); *H01L 21/7685* (2013.01); *H01L 24/48* (2013.01); *H01L 2924/01029* (2013.01); *H01L 23/53252* (2013.01); *H01L 2224/03462* (2013.01); *H01L 24/03* (2013.01); *H01L 2224/05639* (2013.01); *H01L 2224/0345* (2013.01); *H01L 2924/01073* (2013.01); *H01L 2224/05624* (2013.01); *H01L 21/76843* (2013.01); *H01L 2224/05147* (2013.01); *H01L 2924/01033* (2013.01); *H01L 2224/03452* (2013.01); *H01L 2924/01074* (2013.01); *H01L 2924/01025* (2013.01); *H01L 2924/01005* (2013.01); *H01L 2224/0362* (2013.01); *H01L 2224/05644* (2013.01); *H01L 24/05* (2013.01); *H01L 21/76867* (2013.01); *H01L 2924/01013* (2013.01); *H01L 2924/01012*
(Continued)

(58) Field of Classification Search
USPC ......... 257/751, 761, 762, 763, 764, 765, 766, 257/770, 771, E21.584, E23.161; 438/653
See application file for complete search history.

(56) References Cited

U.S. PATENT DOCUMENTS 5,913,147 A * 6/1999 Dubin et al. .................. 438/687
6,025,275 A  2/2000 Efland et al.
(Continued)

FOREIGN PATENT DOCUMENTS

DE 102004024644 A1 12/2005

OTHER PUBLICATIONS

Takamasa Usi et al., "Highly Reliable Copper Dual-Damascene Interconnects With Self-Formed MnSixOy Barrier Layer" IEEE Transactions on Electron Devices, vol. 53, No. 10, Oct. 2006, pp. 2492-2499.

*Primary Examiner* — Teresa M Arroyo
(74) *Attorney, Agent, or Firm* — Infineon Technologies AG

(57) ABSTRACT

One or more embodiments relate to a method of forming a semiconductor device, comprising: forming a structure, the structure including at least a first element and a second element; and forming a passivation layer over the structure, the passivation layer including at least the first element and the second element, the first element and the second element of the passivation layer coming from the structure.

22 Claims, 12 Drawing Sheets

(51) Int. Cl.
*H01L 29/40* (2006.01)
*H01L 21/44* (2006.01)
*H01L 23/532* (2006.01)
*H01L 21/768* (2006.01)
*H01L 23/00* (2006.01)

(52) U.S. Cl.
CPC ........ (2013.01); *H01L 2224/04042* (2013.01); *H01L 2224/05647* (2013.01); *H01L 2924/0103* (2013.01); *H01L 2224/0508* (2013.01); *H01L 2924/01079* (2013.01); *H01L 2924/01047* (2013.01); *H01L 21/76873* (2013.01); *H01L 24/85* (2013.01); *H01L 2224/85375* (2013.01); *H01L 2224/48* (2013.01); *H01L 2224/05082* (2013.01); *H01L 2224/05666* (2013.01); *H01L 2924/0105* (2013.01); *H01L 2224/051* (2013.01); *H01L 2924/01023* (2013.01)
USPC ........... 257/751; 257/761; 257/762; 257/763; 257/764; 257/765; 257/766; 257/770; 257/771; 257/E21.584; 257/E23.161; 438/653

(56) References Cited

U.S. PATENT DOCUMENTS

| | | | |
|---|---|---|---|
| 6,153,521 A | 11/2000 | Cheung et al. | |
| 6,218,732 B1 | 4/2001 | Russell et al. | |
| 6,249,055 B1 * | 6/2001 | Dubin | 257/758 |
| 6,348,731 B1 * | 2/2002 | Ashley et al. | 257/751 |
| 6,841,478 B2 | 1/2005 | McTeer | |
| 7,207,096 B2 | 4/2007 | Gambino et al. | |
| 7,470,992 B2 * | 12/2008 | Thei et al. | 257/765 |
| 2003/0229986 A1 | 12/2003 | Su et al. | |
| 2006/0113675 A1 * | 6/2006 | Chang et al. | 257/763 |
| 2006/0261478 A1 | 11/2006 | Thei et al. | 257/751 |
| 2008/0142972 A1 * | 6/2008 | Redeker et al. | 257/751 |
| 2008/0157362 A1 | 7/2008 | Chang et al. | |
| 2008/0237859 A1 | 10/2008 | Ishizaka et al. | |
| 2008/0237862 A1 * | 10/2008 | Tanaka | 257/751 |
| 2008/0258304 A1 * | 10/2008 | Komura et al. | 257/751 |
| 2008/0280432 A1 * | 11/2008 | Chang et al. | 438/627 |
| 2008/0311739 A1 | 12/2008 | Besling et al. | |
| 2009/0096102 A1 * | 4/2009 | Gambino et al. | 257/751 |
| 2009/0127710 A1 | 5/2009 | Daubenspeck et al. | |
| 2009/0209099 A1 | 8/2009 | Yu et al. | |
| 2009/0218694 A1 | 9/2009 | Kato et al. | |
| 2010/0155951 A1 * | 6/2010 | Koike et al. | 257/751 |
| 2010/0171220 A1 * | 7/2010 | Huang | 257/751 |
| 2010/0176513 A1 * | 7/2010 | Agarwala et al. | 257/758 |
| 2010/0213614 A1 * | 8/2010 | Cohen | 257/762 |
| 2010/0230816 A1 * | 9/2010 | Su et al. | 257/751 |
| 2012/0074573 A1 * | 3/2012 | Dallmann et al. | 257/751 |
| 2012/0112350 A1 | 5/2012 | Kriz et al. | |

* cited by examiner

SEMICONDUCTOR STRUCTURE HAVING METAL OXIDE OR NIRTRIDE PASSIVATION LAYER ON FILL LAYER AND METHOD FOR MAKING SAME

FIELD OF THE INVENTION

One or more embodiments of the present invention relate to semiconductor structures and methods for making semiconductor structures.

BACKGROUND OF THE INVENTION

Conductive structures, such as bond pad structures, formed as part of semiconductor devices may form oxides on the surfaces. Such oxides may reduce the reliability of such devices, especially during wafer probing and bonding. New ways are needed to reduce oxide formation.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
FIGS. 1 through 12 show a method of forming a structure in accordance with an embodiment of the present invention.

FIG. 1 shows a workpiece 210 which may be part of an electronic device such as a semiconductor device. The workpiece 210 may be a homogeneous layer (for example, a dielectric layer). The workpiece 210 may correspond to a semiconductor substrate. The workpiece 210 may include a plurality (e.g. a stack) of sub-layers of different materials (as shown, for example, in FIG. 13A).

The workpiece 210 includes a top surface 210T. An opening 310 may be formed in the workpiece 210 shown in FIG. 1 so as to form the workpiece 210 shown in FIG. 2 that includes an opening 310. The opening 310 may include a bottom surface as well as one or more sidewall surfaces 310S. The opening 310 may have any lateral cross sectional shape. The opening 310 may, for example, be a trench or a hole. In one or more embodiments, workpiece 210 may be or may comprise a dielectric layer such that the opening 310 is formed within a dielectric layer.

Figure 2:
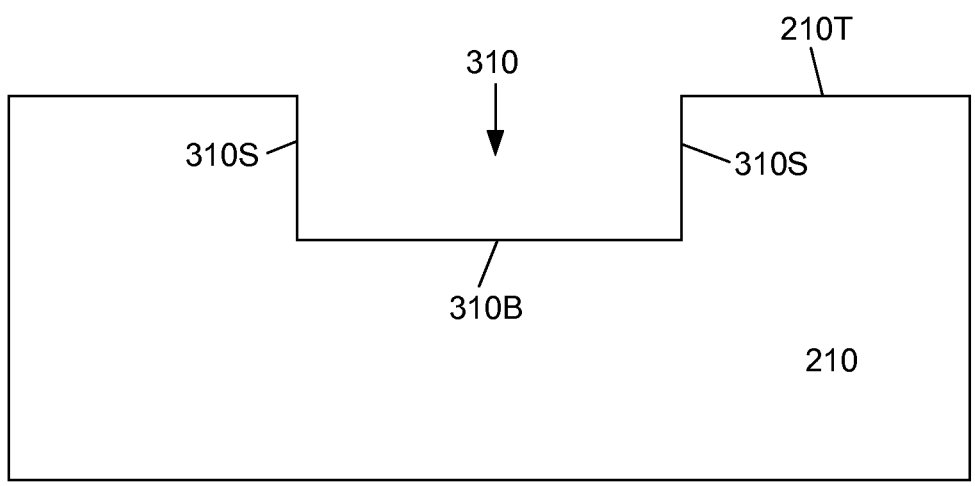

Referring to FIG. 2, the opening 310 includes a bottom surface 310B. The opening 310 further includes one or more sidewall surfaces 310S. In one or more embodiments, the sidewall surfaces 310S may be substantially vertical. In other embodiments, the sidewall surface may be tilted or even step-shaped.

Figure 3:
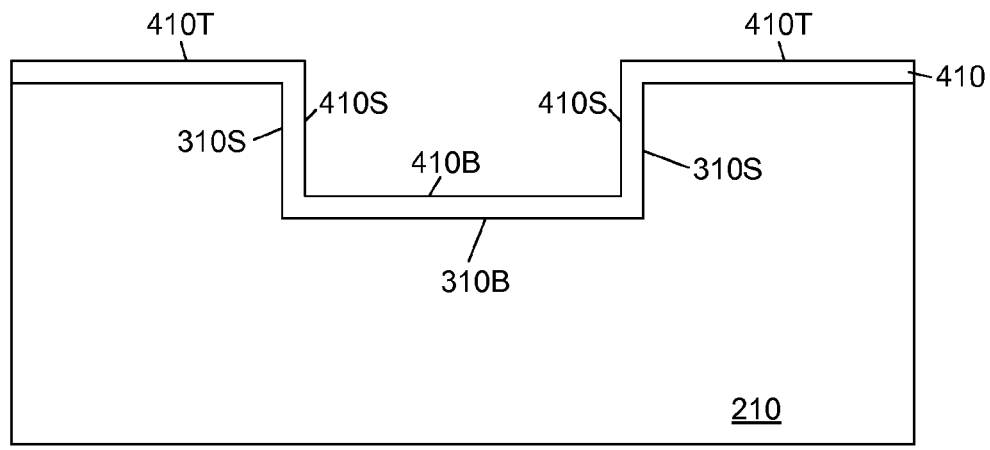

Referring to FIG. 3, a barrier layer 410 may be formed over the workpiece 210 (from FIG. 2). In particular, the barrier layer 410 may be formed over the top surface 210T as well as over the sidewall surfaces 310S and bottom surface 310B of the opening 310.

In one or more embodiments, the barrier layer 410 may be formed directly on the workpiece 210 (from FIG. 2) so that the barrier layer may be deposited directly on the top surface 210T as well as directly on the sidewall surfaces 310S and bottom surface 310B of opening 310B. The formation of the barrier layer 410 may be a deposition process such as a substantially conformal deposition. Referring to FIG. 3, the barrier layer 410 may include a top surface 410T, one or more sidewall surfaces 410S and a bottom surface 410B.

The barrier layer 410 may be a conductive layer. In one or more embodiments, the barrier layer 410 may be a metallic layer. The barrier layer may comprise one or more conductive materials. The barrier layer may comprise one or more metallic materials. The barrier layer 410 may comprise, for example, a metal and/or a metallic alloy and/or a compound (e.g. a metallic compound).

In one or more embodiments, a metallic alloy may comprise at least two metallic elements. In one or more embodiments, a metallic alloy may comprise at least one metallic element and at least one non-metallic element (for example, steel).

In one or more embodiments, a metallic alloy may be a binary alloy. In one or more embodiments, a metallic alloy may be a ternary alloy. In one or more embodiments, a metallic alloy may comprise more than three elements.

In one or more embodiments, the barrier layer 410 may be a homogeneous layer. In one or more embodiments, the barrier layer 410 may comprise a combination or mixture of two or more materials. In one or more embodiments, the barrier layer 410 may comprise a stack of two or more sub-layers of different materials.

In one or more embodiments, the barrier layer 410 may comprise at least one of the periodic table chemical elements selected from the group consisting of Ti (titanium), Ta (tantalum), W (tungsten), and N (nitrogen). The chemical elements may be in any form, such as, for example, metals and/or metallic alloys and/or compounds (e.g. metallic compounds).

As an example, the barrier layer may comprise the chemical element Ti (titanium). The Ti may be in any form, such as, a metal (e.g. titanium metal) and/or a metallic alloy (e.g. titanium alloy) and/or a compound (e.g. a metallic compound such as titanium compound). The titanium compound may be titanium nitride (e.g. TiN). In one or more embodiments, the barrier layer may comprise (or may consist essentially of) titanium metal.

In one or more embodiments, the barrier layer may comprise (or may consist essentially of) any Ti-containing material. A Ti-containing material may be any material that includes the chemical element Ti (titanium). In one or more embodiments, this may include any materials that include titanium atoms. The Ti-containing material may be a conductive material. The Ti-containing material may be a metallic material. The Ti-containing material may be a homogeneous material.

Ti-containing materials may include, for example, titanium metal and/or metallic alloys (e.g. titanium alloys) and/or titanium compounds (e.g. metallic titanium compounds). An example of a titanium compound is titanium nitride. In one or more embodiments, the Ti-containing material is titanium metal.

In one or more embodiments, the barrier layer 410 may comprise the chemical element Ta (tantalum). The Ta (tantalum) may be in the form of tantalum metal and/or a metallic alloy (e.g. tantalum alloy) and/or a compound (e.g. a metallic compound) such as tantalum nitride. Likewise, the W (tungsten) may be in the form, for example, of tungsten metal and/or a metallic alloy (such as tungsten alloy) and/or a compound (e.g. a metallic compound) such as tungsten nitride.

In one or more embodiments, the barrier layer may, for example, comprise (or may consist essentially of) one or more materials selected from the group consisting of titanium metal, titanium alloy, titanium compound (e.g. titanium nitride), tantalum metal, tantalum alloy, tantalum compound (e.g. tantalum nitride), tungsten metal, tungsten alloy, tungsten compound (e.g. tungsten nitride). The barrier layer may include mixtures and combinations of materials. In one or more embodiments, the barrier layer may comprise titanium metal. In one or more embodiments, the barrier layer may comprise (or may consist essentially of) titanium-tungsten alloy.

In one or more embodiments, the barrier layer 410 may be a homogeneous layer. For example, in one or more embodiments, the barrier layer 410 may consist essentially of titanium metal. In one or more embodiments, the barrier layer 410 may include a mixture or combination of two or more materials. In one or more embodiments, the barrier layer 410 may comprise a stack of two or more sub-layers. Two or more of the sub-layer may comprise different materials (for example, materials having different compositions). As an example, in one or more embodiments, the barrier layer may comprise a stack of titanium metal/titanium nitride.

The barrier layer 410 may, for example, be deposited using a sputtering process and/or a chemical vapor deposition process.

In one or more embodiments, the barrier layer 410 may have a thickness between about 10 nm and about 100 nm. In one or more embodiments, the barrier layer 410 may have a thickness of about 15 nm or greater. In one or more embodiments the barrier layer 410 may have a thickness of about 50 nm or less. In one or more embodiments the barrier layer 410 may have a thickness of about 30 nm or less. In one or more embodiments, the barrier layer 410 may have a thickness of about 20 nm.

Figure 4:
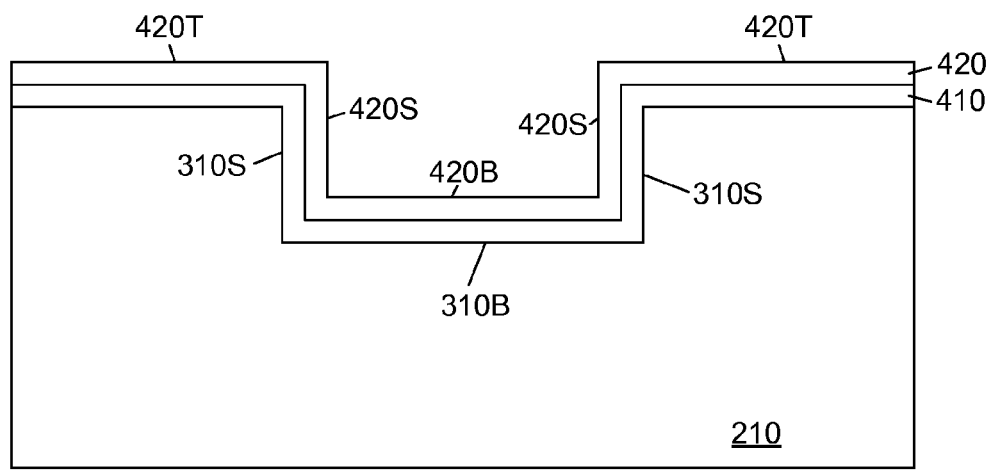

Referring to FIG. 4, a seed layer 420 may then be deposited over the barrier layer 410. The seed layer 420 may be deposited over the top surface 410T of the barrier layer 410 as well as over the sidewall surfaces 410S and the bottom surface 410B of the barrier layer 410. The seed layer 420 may be deposited within the opening 310 as well as outside the opening 310. The deposition of the seed layer may be a substantially conformal deposition. The seed layer 420 may include a top surface 420T, one or more sidewall surfaces 420S and a bottom surface 420B as shown in FIG. 4.

The seed layer 420 may be a conductive layer. The seed layer may be a metallic layer. The seed layer 420 may comprise one or more conductive materials. The seed layer 420 may comprise one or more metallic materials. The seed layer 420 may include a metal and/or a metallic alloy and/or a compound (e.g. a metallic compound). In one or more embodiments, the seed layer may be a homogeneous layer. In one or more embodiments, the seed layer may comprise a combination or mixture of two or more different materials. In one or more embodiments, the seed layer 420 may comprise a stack of two or more sub-layers of different materials.

In one or more embodiments, the seed layer 420 may comprise the chemical element Cu (copper). The Cu may be in any form such as copper metal, metallic alloy (e.g. copper alloy) and/or metallic compound (e.g. copper compound). In one or more embodiments, the copper alloy may include a doped copper.

In one or more embodiments, the seed layer 420 may comprise (or may consist essentially of) the element Cu (copper) and at least one additional element from the periodic table. In one or more embodiments, an additional element may be a metallic element from the period table. In one or more embodiments, an additional element may be a non-metallic element. In one or more embodiments, an additional element may be selected from the group consisting of Al (aluminum), Mn (manganese), Mg (magnesium), V (vanadium), Cr (chromium), Sn (tin), Zn (zinc), and Ti (titanium). In one or more embodiments, the seed layer 420 may comprise atoms of at least one of aluminum atoms, manganese atoms, magnesium atoms, vanadium atoms, chromium atoms, tin atoms, zinc atoms and titanium atoms. In one or more embodiments, the additional element may be Al (aluminum).

Any of the additional elements may be in the form, for example, of a metal and/or metal alloy and/or compound (e.g. metallic compound). As examples, it is possible that that seed layer may include at least one of copper metal, copper alloy, copper compound, manganese metal, manganese alloy, manganese compound, magnesium metal, magnesium alloy, magnesium compound, vanadium metal, vanadium alloy, vanadium compound, chromium metal, chromium alloy, chromium compound, tin metal, tin alloy, tin compound, zinc metal, zinc alloy, zinc compound, titanium metal, titanium alloy, and titanium compound.

The seed layer may include combinations of materials. The seed layer 420 may include an atomic percentage of the element Cu (copper) and an atomic percentage of an addition element (for example, an atomic percentage of the chemical element Al (aluminum) if Al is an additional element). In one or more embodiments, the atomic percentage of the Cu may be about 90% or more, about 95% or more, about 97% or more, about 98% or more, about 99% or more, about 99.5% or more, or about 99.9% or more. In some embodiments, the atomic percent of the Cu may be about 99.9% or less. In one or more embodiments, the atomic percentage of an additional element (for example, Al) may be about 10% or less, 5% or less, 3% or less, 2.5% or less, 2% or less, 1% or less, 0.5% or less, 0.2% or less, or 0.1% or less. In one or more embodiments, the atomic percentage of an additional element may be about 0.1% or more.

In one or more embodiments, there may be more than one additional element. In one or more embodiments, the atomic percentage of all additional elements together (if there is more than one additional element) may be about 10% or less, 5% or less, 3% or less, 2.5% or less, 2% or less, 1% or less, 0.5% or less, 0.2% or less, or 0.1% or less. In one or more embodiments, the atomic percentage of all additional elements together may be about 0.1% or more.

In some embodiments, an additional element may be the chemical element Al (aluminum). Hence, in one or more embodiments, the seed layer may comprise (or may consist essentially of) the element Cu and the element Al. Hence, the seed layer may include both copper atoms and aluminum atoms. The Cu and Al may be in any form such metals (e.g. copper metal and/or aluminum metal), metallic alloy and/or compounds (e.g. metallic compounds). In one or more embodiments, seed layer may comprise a metallic alloy that comprises (or consists essentially of) the elements Cu and Al. In one or more embodiments, the metallic alloy may be a copper alloy. In one or more embodiments, the copper alloy may be a copper-aluminum alloy. In one or more embodiments, the copper-aluminum alloy may be an aluminum-doped copper.

In some embodiments, the seed layer may comprise (or may consist essentially of) a material (e.g. a seed layer material) that includes Cu (copper) and the one or more additional chemical elements as described above. In one or more embodiments, an additional element may be Al (aluminum). In some embodiments, the seed layer material may be a homogenous material. In some embodiments, the seed layer material may be a metallic material. In some embodiments, the seed layer material may include at least one metal and/or at least one metallic alloy and/or at least one compound (e.g. metallic compound).

As noted, an additional element may be Al (aluminum). Hence, the seed layer material may include Cu (copper) and (Al) aluminum. This material may be referred to as a Cu/Al-containing material. Hence, the Cu/Al-containing material may be any material that includes Cu (copper) and Al (aluminum). For example, the Cu/Al-containing material may include copper atoms and aluminum atoms. In one or more embodiments, the Cu/Al material may consist essentially of the elements Cu (copper) and Al (aluminum). The Cu/Al-containing material may be a conductive material. The Cu/Al-containing material may be a metallic material. In one or more embodiments, the Cu/Al material may be a homogeneous material.

The seed layer material may include an atomic percentage of the element Cu (copper) and an atomic percentage of an addition element (for example, the chemical element Al (aluminum)). In one or more embodiments, the atomic percentage of the Cu may be about 90% or more, about 95% or more, about 97% or more, about 98% or more, about 99% or more, about 99.5% or more, or about 99.9% or more. In some embodiments, the atomic percent of the Cu may be about 99.9% or less. In one or more embodiments, the atomic percent of an additional element (for example, Al) may be about 10% or less, 5% or less, 3% or less, 2.5% or less, 2% or less, 1% or less, 0.5% or less, 0.2% or less, or 0.1% or less. In one or more embodiments, the atomic percentage of an additional element may be about 0.1% or more.

In one or more embodiments, the atomic percent of all additional elements together (if there is more than one additional element) may be about 10% or less, 5% or less, 3% or less, 2.5% or less, 2% or less, 1% or less, 0.5% or less, 0.2% or less, or 0.1% or less. In one or more embodiments, the atomic percentage of all additional elements together may be about 0.1% or more.

In some embodiments, the seed layer material may include a metallic alloy. Hence, in one or more embodiments, the seed layer 420 may comprise (or may consist essentially of) a metallic alloy. The metallic alloy may comprise (or may consist essentially of) the chemical element Cu and at least one additional element. As discussed, in one or more embodiments, an additional element may be a metallic element. In one or more embodiments, an additional element may be a non-metallic element. In one or more embodiments, an additional element may be selected from the group consisting of Al (aluminum), Mn (manganese), Mg (magnesium), V (vanadium), Cr (chromium), Sn (tin), Zn (zinc), and Ti (titanium).

Hence, in one or more embodiments, the seed layer 420 may comprise a metallic alloy. The metallic alloy may include an atomic percentage of the element Cu (copper) and an atomic percentage of an additional element (for example, the chemical element Al (aluminum)). In one or more embodiments, the atomic percentage of the Cu may be greater than about 50%, about 90% or more, about 95% or more, about 97% or more, about 98% or more, about 99% or more, about 99.5% or more, or about 99.9% or more. In some embodiments, the atomic percent of the Cu may be about 99.9% or less. In one or more embodiments, the atomic percent of an additional element (for example, Al) may be about 10% or less, 5% or less, 3% or less, 2.5% or less, 2% or less, 1% or less, 0.5% or less, 0.2% or less, or 0.1% or less. In one or more embodiments, the atomic percentage of an additional element may be about 0.1% or more.

In one or more embodiments, the atomic percent of all additional elements together (if there is more than one additional element) may be about 10% or less, 5% or less, 3% or less, 2.5% or less, 2% or less, 1% or less, 0.5% or less, 0.2% or less, or 0.1% or less. In one or more embodiments, the atomic percentage of all additional elements together may be about 0.1% or more.

In one or more embodiments, the metallic alloy may comprise (or may consist essentially of) Cu (copper) and Al (aluminum). The metallic alloy may be a copper alloy such as a copper-aluminum alloy.

The seed layer 420 may be deposited using a sputtering process and/or a chemical vapor deposition process and/or a physical vapor deposition.

In one or more embodiments, the seed layer 420 may have a thickness between about 25 nm (nanometer) and about 150 nm. In one or more embodiments, the seed layer 420 may have a thickness of about 30 nm (nanometer) or greater. In one or more embodiments, the seed layer 420 may have a thickness of about 35 nm (nanometer) or greater. In one or more embodiments, the seed layer 420 may have a thickness of about 40 nm (nanometer) or greater. In one or more embodiments, the seed layer 420 may have a thickness of about 100 nm (nanometer) or less. In one or more embodiments, the seed layer 420 may have a thickness may be about 75 nm or less. In one or more embodiments, the seed layer 420 may have a thickness may be about 50 nm.

Figure 5:
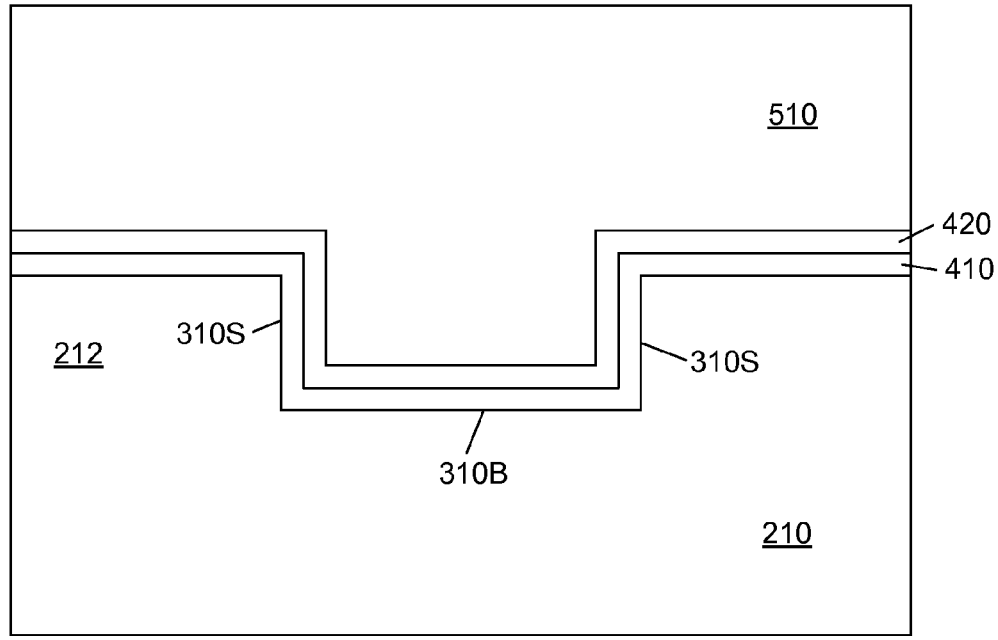

Referring to FIG. 5, a masking layer 510 may then be deposited over the seed layer 420. In one or more embodiments, the masking layer 510 may be a photoresist layer. The masking layer 410 may be deposited over the top surface 420T, the sidewall surfaces 420S and the bottom surface 420B of the seed layer 420. The masking layer 510 may be deposited within the opening 310 as well as outside the opening 310. In one or more embodiments, the masking layer 510 may comprise a galvanic resist material.

Figure 6:
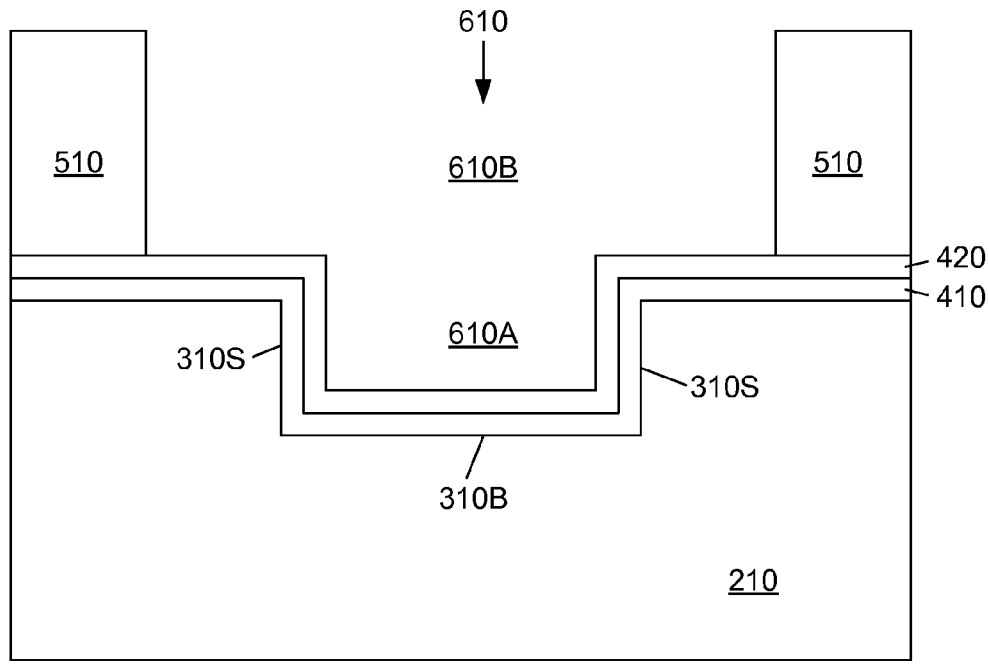

Referring to FIG. 6, a portion of the masking layer 510 may be removed so as to form an opening 610 within the masking layer 510. In one or more embodiments, the removal of the masking layer 510 may comprise a selective removal process. The masking layer 510 may be removed from within the opening 310. The opening 610 may viewed as including an upper portion 610B and a lower portion 610A.

Figure 7:
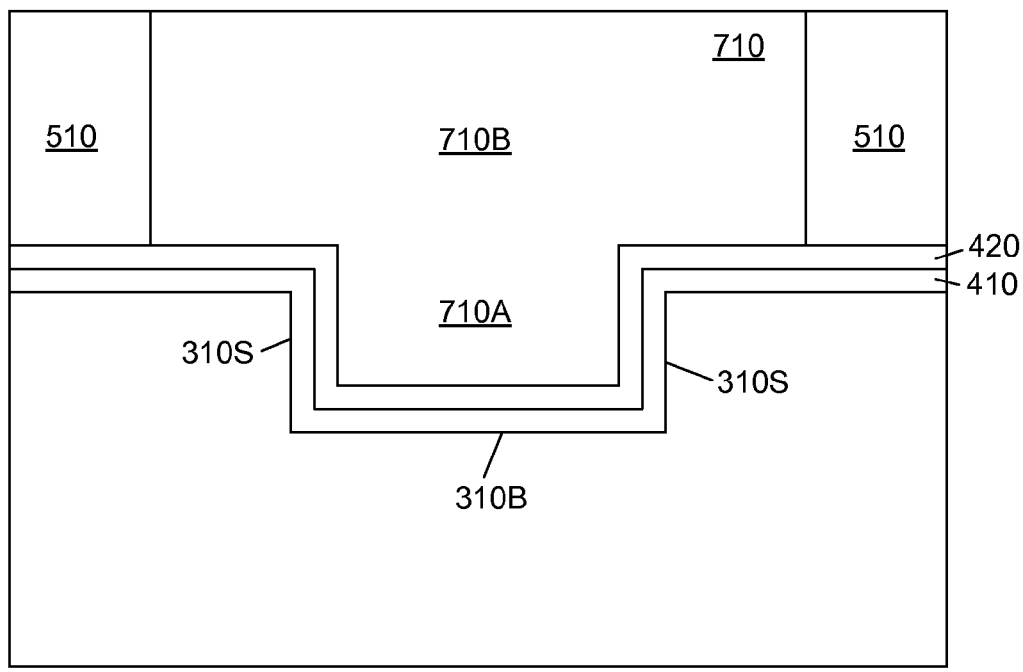

Referring to FIG. 7, a fill layer 710 may be deposited within the opening 610. The fill layer 710 may be formed over the seed layer 420. The deposition may comprise an electroplating process. The electroplating process may utilize an electrodeposition process. The fill layer 710 may be electroplated over (for example, directly on) the seed layer. After the deposition of the fill layer 710, a chemical mechanical polishing process may be applied to create a level top surface as shown in FIG. 7.

The fill layer 710 may be a conductive layer. The fill layer 710 may be a metallic layer. The fill layer 710 may comprise at least one metallic material. The metallic material may, for example, be in the form of a metal, a metallic alloy or metallic compound. In one or more embodiments, the fill layer may comprise a homogeneous layer.

In one or more embodiments, the fill layer 710 may comprise at least one of the periodic table chemical elements selected from the group consisting of the elements Cu (copper), Al (aluminum), Au (gold), and Ag (silver). Each of the periodic table chemical elements may, for example, be in any form such as a metal and/or a metallic alloy and, even, possibly a metallic compound. For example, the Cu (copper) may, for example, be in the form of copper metal and/or a metallic alloy (for example, a copper alloy) and/or a metallic compound (for example, a metallic copper compound). The same is true for the other chemical elements.

Figure 8:
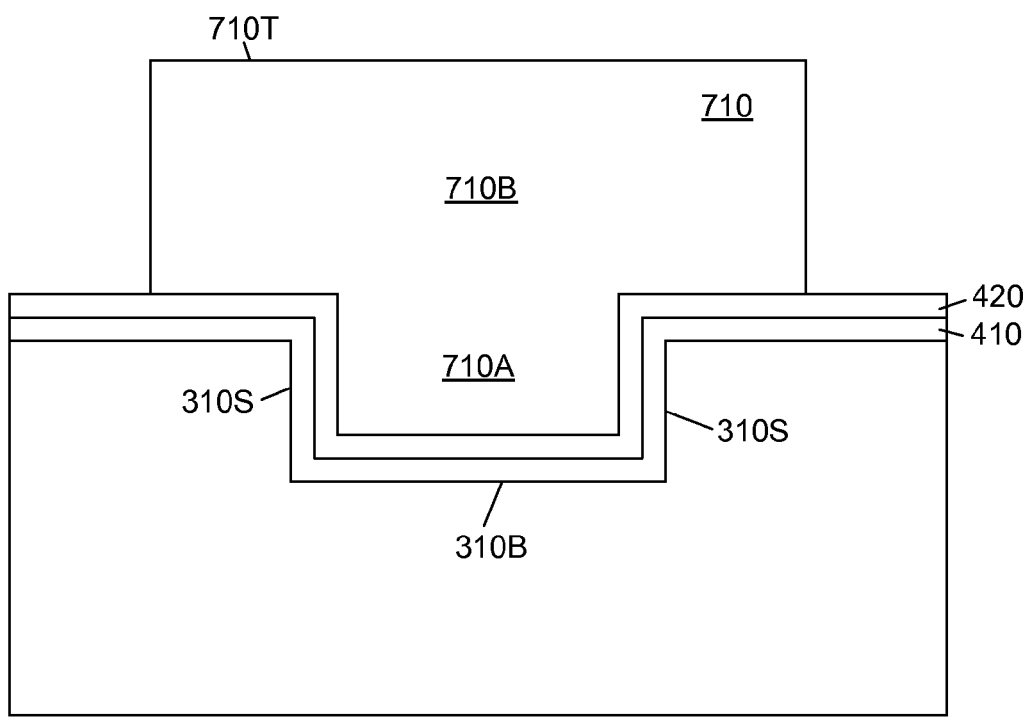

Referring to FIG. 8, the masking layer 510 (for example, a photoresist layer) may be removed. The removal may be accomplished by an etching process. The etching process may comprise a wet etching process. The etching process may comprise a dry etching process.

Figure 9:
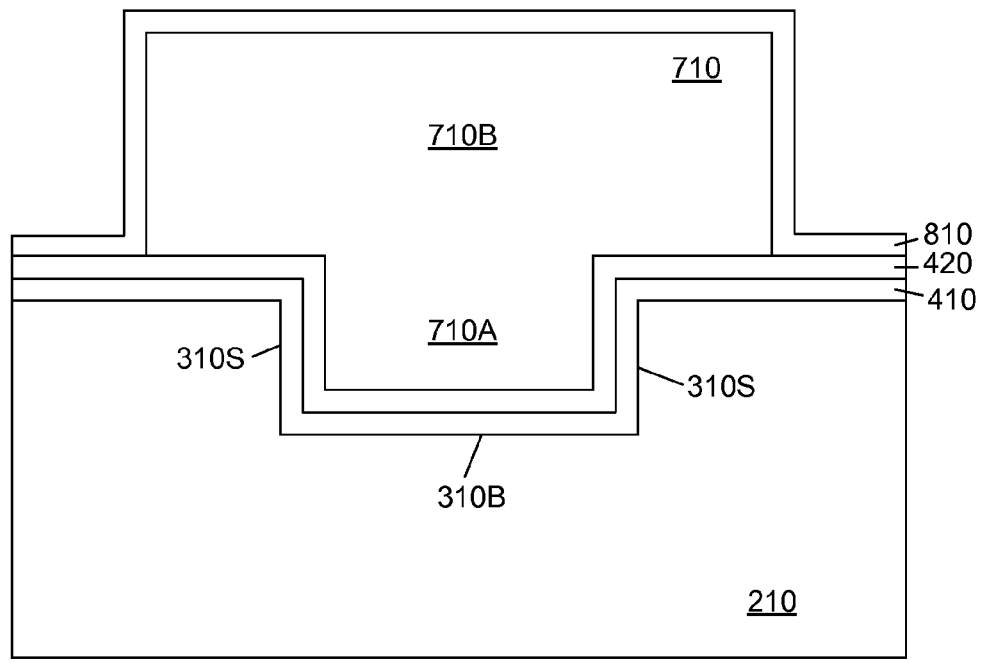

Referring to FIG. 9, a barrier layer 810 may be deposited over the fill layer 710 as well as over the top surface of the seed layer 420. In one or more embodiments, the barrier layer 810 may include one or more of the materials as described above with regards to barrier layer 410. In one or more embodiments, the barrier layer 810 may include the same materials as barrier layer 410. In one or more embodiments, the barrier layer 810 may include one or more different materials from barrier layer 410.

Figure 10:
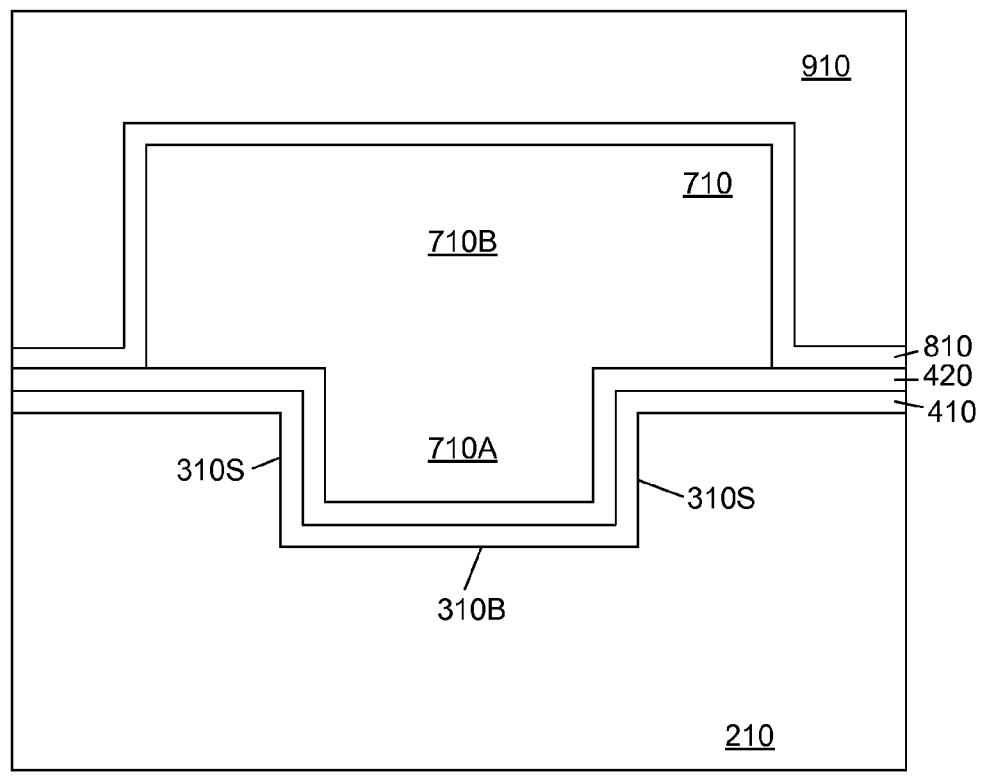

Referring to FIG. 10, a dielectric layer 910 may be formed over the barrier layer 810 (and over the fill layer 710). The dielectric layer 910 may comprise one or more dielectric materials. The dielectric materials may be selected from the group consisting of oxide, nitride, oxynitride, and combinations thereof. The dielectric layer may comprise a combination (e.g. mixture) of two or more materials.

Figure 11:
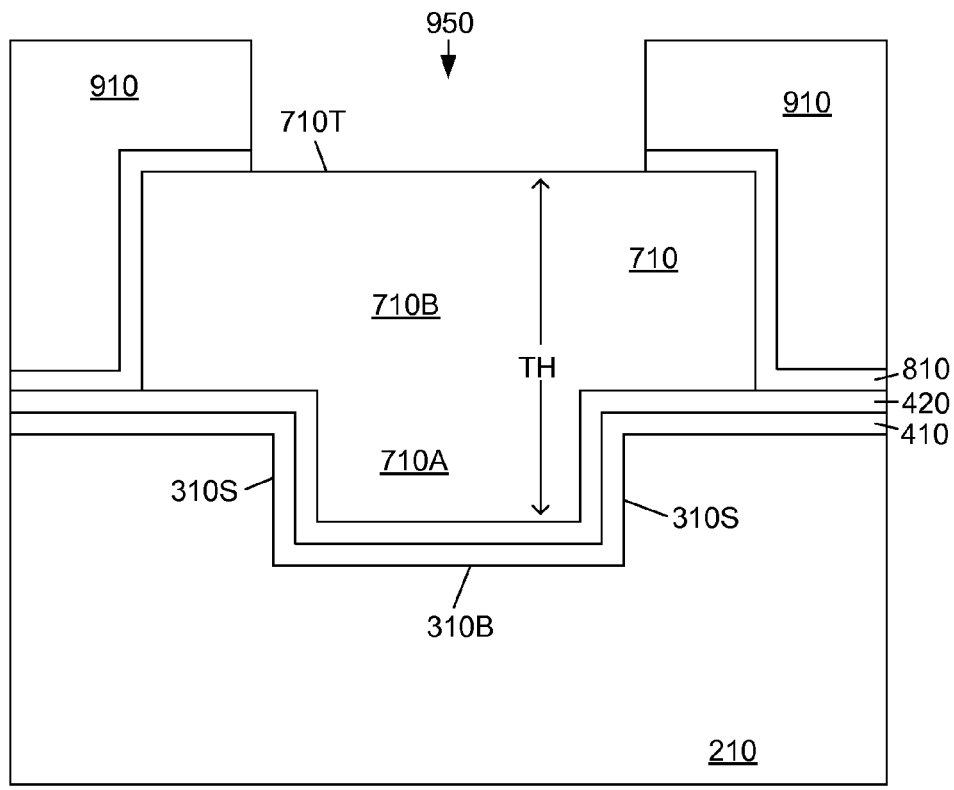

Referring to FIG. 11, an opening 950 may be formed through the dielectric layer 910 and the barrier layer 810 so as to expose a top surface 710T of the fill layer 710.

Figure 12:
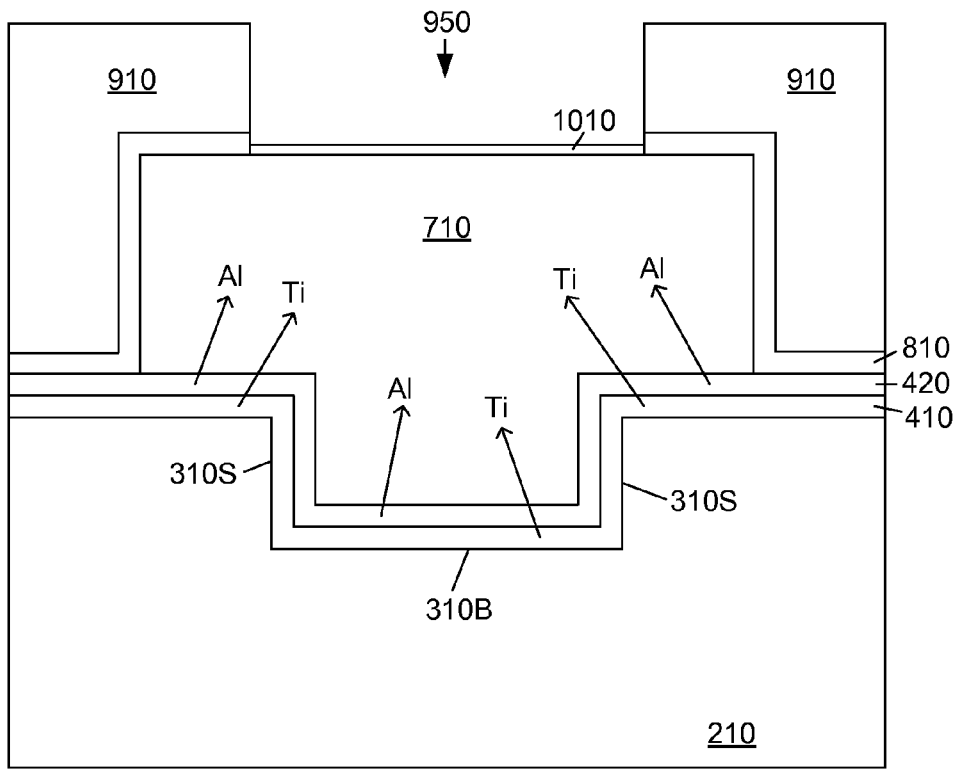

Referring to FIG. 12, at least one anneal process may be performed. The anneal process may cause materials from seed layer 420 as well as from the barrier layer 410 to move (e.g. migrate) into the fill layer 710. The movement may be the result of a diffusion process. More particularly, the anneal process may cause these materials to move through the fill layer 710 to the exposed top surface 710T of the fill layer 710.

As discussed, the seed layer may include the chemical element Al (aluminum) (and/or possibly some other additional element(s)). Also, the barrier layer may include the chemical element Ti (titanium). As a result of the anneal process, the Al (aluminum) from the seed layer 420 (and/or possibly some other additional element(s) from the seed layer) may move into the fill layer 710 and move to the top surface 710T of the fill layer 710. Likewise, Ti (titanium) from the barrier layer 410 may move into the fill layer 710 and move to the top surface 710T of the fill layer 710.

It is noted that the movement of the Ti (titanium) may be in the form of titanium atoms. Likewise, the movement of the Al (aluminum) from the seed layer may be in the form of atoms (e.g. aluminum atoms). The titanium atoms and/or aluminum atoms may be individual atoms or they may be part of more complex structures such as molecules and/or compounds. Individual atoms may be neutral atoms or may be ions.

While not wishing to be bound by theory, the movement of the Ti (titanium) and Al (aluminum) may be by a diffusion mechanism.

The Ti (titanium) and/or Al (aluminum) may reach the top surface 710T. Referring to FIG. 12, a passivation layer 1010 may form over at least a portion of the exposed top surface 710T of fill layer 710. The passivation layer 1010 may include the Ti (titanium) and/or the Al (aluminum) that has come from the barrier layer and/or the seed layer. Hence, in one or more embodiments, it may not be necessary to deposit the Ti and/or the Al over the top of the fill layer.

Hence, in one or more embodiments, the passivation layer 1010 may form from self passivation process in that at least a portion of the components (e.g. chemical elements) of the passivation layer may come from the structure itself. For example, at least a portion of the components (e.g. chemical elements) of the passivation layer may come from the fill layer and/or the seed layer and/or the barrier layer and/or the workpiece. In one or more embodiments, at least a portion of the components (e.g. chemical elements) of the passivation layer may come from the barrier layer and/or the seed layer.

In one or more embodiments, the passivation layer 1010 may include both Ti (titanium) and Al (aluminum). In one or more embodiments, the passivation layer 1010 may include the periodic table chemical element O (oxygen) and/or the period table chemical element N (nitrogen). In one or more embodiments, the passivation layer 1010 may be a homogeneous layer. In one or more embodiments, the passivation layer 1010 may include two or more sub-layers of different materials. In one or more embodiments, the passivation layer may be a conductive layer. In one or more embodiments, the passivation layer may be a metallic layer. In one or more embodiments, the passivation layer may be a dielectric layer. In one or more embodiments, the dielectric layer may include one or more oxides.

In one or more embodiments, the passivation layer 1010 may include a material that includes Ti (titanium) and/or Al (aluminum). The material may, for example, include one or more metals, one or more metallic alloys and/or one or more compounds. The one or more compounds may include one or more metallic compounds and/or one or more non-metallic compounds.

The passivation layer may include one or more non-metallic compounds. The passivation layer may include one or more dielectric materials. The passivation layer may include at least one oxide and/or at least one nitride.

In one or more embodiments, the passivation layer 1010 may comprise a compound that includes (1) periodic table chemical element O (oxygen) and/or the periodic table element N (nitrogen) and (2) at least one of the periodic table chemical elements Al (aluminum) and Ti (titanium). In one or more embodiments, the passivation layer 1010 may comprise a compound that includes (1) periodic table chemical element O (oxygen) and/or N and (2) both Al (aluminum) and Ti (titanium). In one or more embodiments, the compound may be a non-metallic compound. In one or more embodiments the compound may be a metallic compound. In one or more embodiments, the compound may be a dielectric material. In one or more embodiments, the compound may be an oxide. In one or more embodiments, the compound may be a nitride.

In one or more embodiments, the passivation layer may include an oxide that includes at least one of Al (aluminum) and Ti (titanium). In one or more embodiments, the passivation layer may comprise an oxide that includes O (oxygen) and both Al (aluminum) and Ti (titanium). In one or more embodiments, the passivation layer may include an oxide that includes both Al (aluminum) and Ti (titanium). In one or more embodiments, the passivation layer may include aluminum oxide (for example, $Al_2O_3$) and/or titanium oxide (for example, $TiO_2$).

In one or more embodiments, the Al (aluminum) of the passivation layer 1010 may be in the form of a compound. In one or more embodiments, the Al (aluminum) of the passivation layer 1010 may be in the form of aluminum oxide (for example, $Al_2O_3$). In one or more embodiments, the Ti (titanium) of the passivation layer 1010 may be in the form of a compound. In one or more embodiments, the Ti (titanium) of the passivation layer 1010 may be in the form of titanium oxide (for example, $TiO_2$). In one or more embodiments, the passivation layer 1010 may include aluminum oxide and/or titanium oxide. In one or more embodiments, the passivation layer 1010 may include both aluminum oxide and titanium oxide.

The passivation layer 1010 may serve to increase the corrosion resistance of the surface of the fill layer 710 for such activities as probing and wire bonding. For example, the protective layer 1010 may help to inhibit or eliminate the growth of other oxides (such as copper oxide) on the top surface 710T of the fill layer 710. The passivation layer 1010 may thus serve as a passivation layer which may help to reduce or prevent the formation of unwanted materials (e.g. for example, oxides such as copper oxide) on the top surface of the fill layer.

In one or more embodiments, the passivation layer 1010 may be in direct contact with the top surface 710T of the fill layer 710.

Referring once again to FIG. 12, it is noted that the elements Ti (titanium) and Al (aluminum) are shown in FIG. 12 as moving to a top surface of the fill layer 710. It is noted that instead of Al (or in addition to Al) it is, of course, possible that at least one other additional element (as discussed above) moves from the seed layer 420 to the top surface of the fill layer 710. Hence, the passivation layer may include any of the additional elements added to the seed layer. As noted, in some embodiments, an additional element may a metallic element. In some embodiments, an additional element may be a non-metallic element. In some embodiments, an additional element may be selected from the group consisting of Al, Mg, Mn, V, Cr, Sn, and Zn. The additional elements may thus appear in the passivation layer.

In some embodiments, the chemical element Ti may be added to the seed layer. Hence, in some embodiments, it may be possible that the Ti as well as the Al (and/or at least one other additional element) may come from the seed layer and move to a top surface of the fill layer as a result of the anneal process. The Ti as well as one or more of the additional element may appear in the passivation layer.

In some embodiments, it may also be possible that a first element from the barrier layer and/or the seed layer as well as a second element from the barrier layer/or the seed layer move to a top surface of the fill layer as a result of the anneal process. The first element and the second element may appear in the passivation layer.

It is possible that during wire bonding and/or probing at least a portion of the passivation layer 1010 may be removed. It is possible, in one or more embodiments, that at least a portion of the passivation layer remains. Hence, in one or more embodiments, the passivation layer may overlie at least a portion of the top surface 710T of the fill layer 710.

In one or more embodiments, the anneal process may take place at a temperature which is equal to or greater than about 100° C. In one or more embodiments, the anneal process may take place at a temperature which is equal to or greater than about 250° C. In one or more embodiments, the anneal process may take place at a temperature which is equal to or greater than about 300° C. In one or more embodiments, the anneal process may take place at a temperature which is equal to or greater than about 350° C. In one or more embodiments, the anneal process may take place at a temperature which is equal to or greater than about 400° C. In one or more embodiments, the anneal process may take place at a temperature which is equal to or greater than about 450° C. In one or more embodiments, the anneal process may take place at a temperature which is equal to or less than about 550° C. In one or more embodiments, the anneal process may take place at a temperature which is less than or equal to about 500° C.

In one or more embodiments, the anneal process may have a time period of about 5 minutes or greater. In one or more embodiments, the anneal process may have a time period of about 10 minutes or greater. In one or more embodiments, the anneal process may have a time period of about 15 minutes or greater. In one or more embodiments, the anneal process may have a time period of about 30 minutes or greater. In one or more embodiments, the anneal process may have a time period of about 45 minutes or greater. In one or more embodiments, the anneal process may have a time period of about 60 minutes or greater. In one or more embodiments, the anneal process may have a time period of about 75 minutes or greater. In one or more embodiments, the anneal process may have a time period of about 90 minutes or less.

In some embodiments, it is conceivable that any of the temperatures provided above may be used in combination with any of the time periods provided above to provide anneal processes having temperatures and time periods.

Referring again to FIG. 11, in one or more embodiments, the fill layer 710 may have a thickness TH of at least about 1.5 microns (μm). In one or more embodiments, the fill layer 710 may have a thickness of at least about 2 microns. In one or more embodiments, the fill layer 710 may have a thickness of at least about 2.5 microns. In one or more embodiments, the fill layer 710 may have a thickness of at least about 3 microns. In one or more embodiments, the fill layer 710 may have a thickness of at least about 3.5 microns. In one or more embodiments, the fill layer 710 may have a thickness of at least about 4 microns. In one or more embodiments, the fill layer 710 may have a thickness of at least about 4.5 microns. In one or more embodiments, the fill layer 710 may have a thickness of at least about 5 microns. In one or more embodiments, the fill layer 710 may have a thickness of at least about 5.5 microns. In one or more embodiments, the fill layer 710 may have a thickness of at least about 6 microns. In one or more embodiments, the fill layer 710 may have a thickness of about 7 microns or less.

In one or more embodiments, portion 710B of fill layer 710 may have a thickness of at least about 0.5 microns (μm). In one or more embodiments, the portion 710B of fill layer 710 may have a thickness of at least about 1 microns. In one or more embodiments, the portion 710B of fill layer 710 may have a thickness of at least about 1.5 microns. In one or more embodiments, the portion 710B of fill layer 710 may have a thickness of at least about 2 microns. In one or more embodiments, the portion 710B of fill layer 710 may have a thickness of at least about 2.5 microns. In one or more embodiments, the portion 710B of fill layer 710 may have a thickness of at least about 3 microns. In one or more embodiments, the portion 710B of fill layer 710 may have a thickness of at least about 3.5 microns. In one or more embodiments, the portion 710B of fill layer 710 may have a thickness of at least about 4 microns. In one or more embodiments, the portion 710B of fill layer 710 may have a thickness of at least about 4.5 microns. In one or more embodiments, the portion 710B of fill layer 710 may have a thickness of at least about 5 microns.

Referring again to FIG. 1, it is understood that, one or more embodiments, the workpiece 210 may, for example, represent a layer, such as a dielectric layer so that the workpiece 210 shown in FIG. 2 may represent a dielectric layer having an opening 310. Likewise, it may be possible that the workpiece 210 from FIG. 1 represent a substrate (e.g. a semiconductor substrate) such that the workpiece 210 shown in FIG. 2 may represent a substrate having an opening.

However, it may also be possible that the workpiece 210 from FIG. 1 represent a combination (for example, a stack) of two or more layers. Likewise, the workpiece 210 from FIG. 2 may represent a combination (for example, a stack) of two or more layers having an opening 310.

Figure 13A:
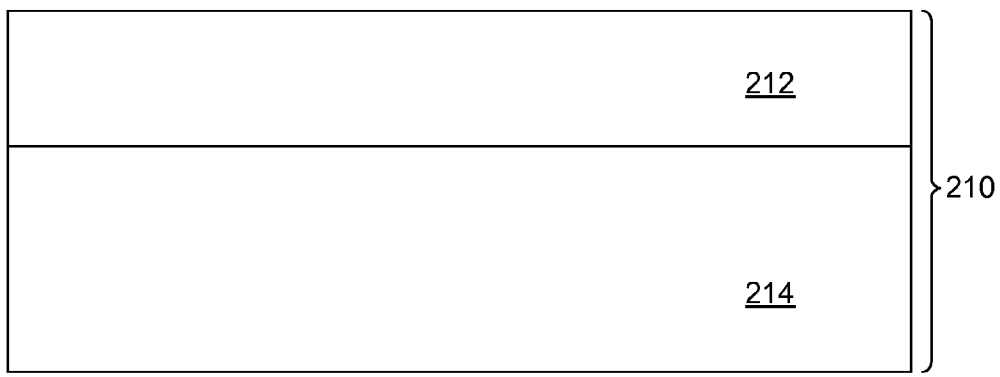
FIG. 13A shows a structure in accordance with an embodiment of the present invention.
Figure 13B:
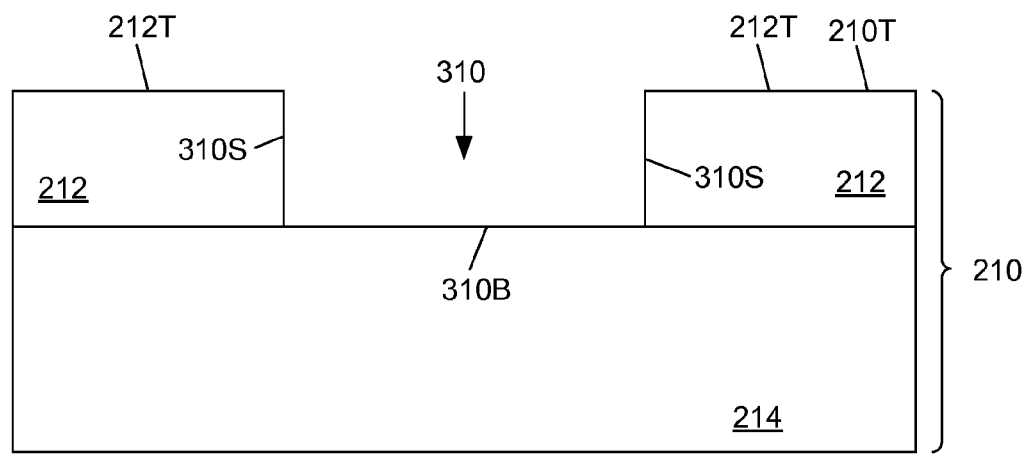
FIG. 13B shows a structure in accordance with an embodiment of the present invention.
Figure 13C:
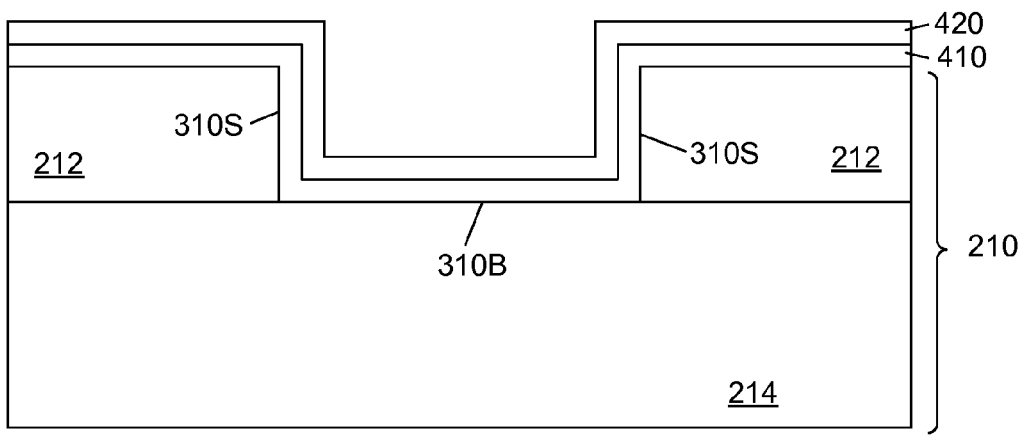
FIG. 13C shows a structure in accordance with an embodiment of the present invention.

FIG. 13A shows that workpiece 210 may represent a layer 212 over a layer 214. Referring to FIG. 13B, the opening 310 may thus be formed within (or through) the layer 212. The opening may, for example, expose the layer 214. The layer 212 may have a top surface 212T corresponding to the top surface of the workpiece 210. FIG. 13C shows (as is shown in FIG. 4) that the barrier layer 410 may be formed over the workpiece 210 that includes opening 310. This time, the workpiece 210 includes a layer 212 over a layer 214, so that the opening 310 is formed within (or through) the layer 212. It may be possible that the barrier layer 410 is makes direct contact the layer 214.

Figure 14:
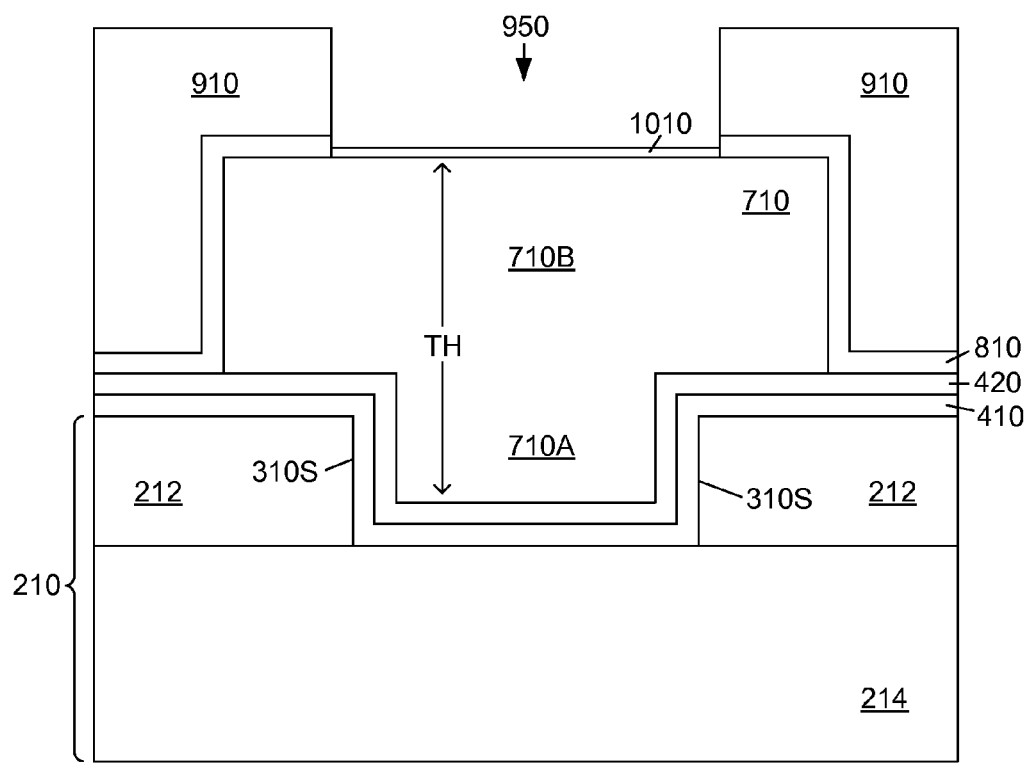
FIG. 14 shows a structure in accordance with an embodiment of the present invention.

FIG. 14 shows the same structure from FIG. 12, except that the workpiece 210 is now shown to include a layer 212 over a layer 214. In one or more embodiments, the layer 212 may be dielectric layer. The layer 212 may include one or more dielectric materials such as an oxide (such as silicon oxide), a nitride (such as silicon nitride) and/or an oxinitride (such as silicon oxinitride). In one or more embodiments, the layer 212 may be passivation layer for a semiconductor chip or integrated circuit.

Referring to FIG. 14, in one or more embodiments, layer 214 may include (or may be) a substrate. A substrate may be any substrate such as a semiconductor substrate. The semiconductor substrate may be a bulk-semiconductor substrate (such as a bulk-silicon substrate). The semiconductor substrate may be an SOI substrate (e.g. a semiconductor on insulator substrate). The SOI substrate may be a silicon on insulator substrate.

In some embodiments, the portion 710B (as seen in FIG. 14) may represent a metal line of a metallization level. Likewise, in some embodiments, the portion 710A may represent a conductive via that electrical couples the portion 710B (for example, a metal line) to the substrate 214. A conductive via that coupled a metallization level to a semiconductor substrate may also be referred to as a conductive contact.

Figure 15:
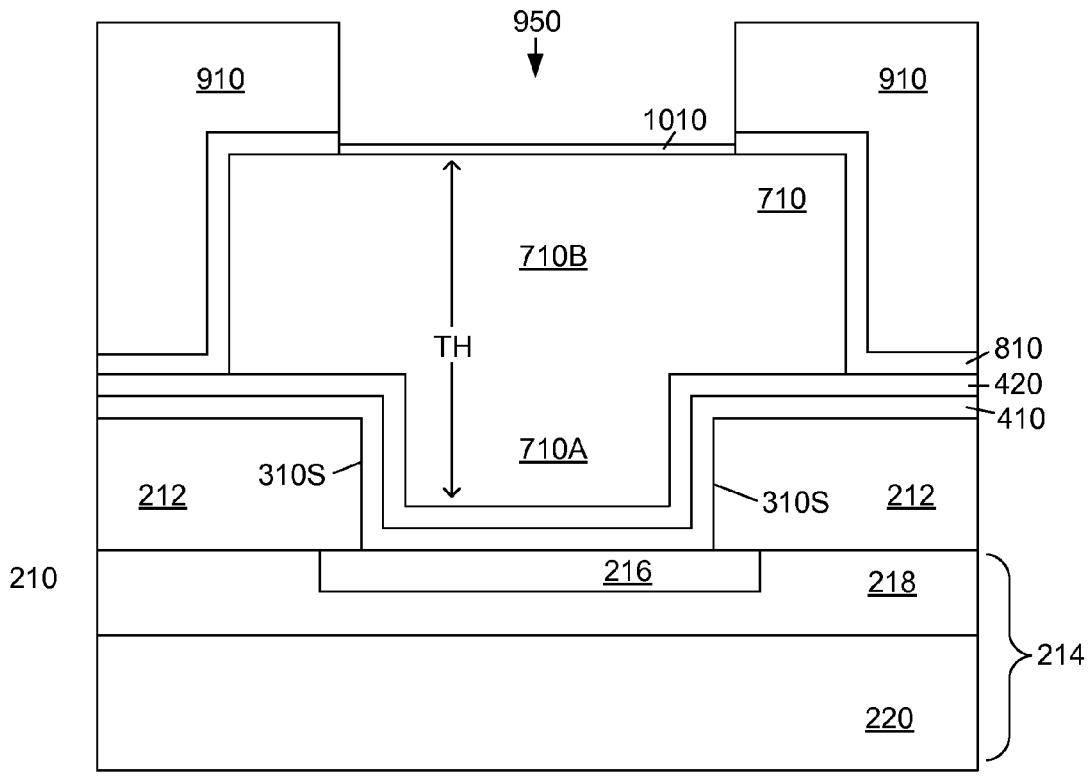
FIG. 15 shows a structure in accordance with an embodiment of the present invention.
Figure 16:
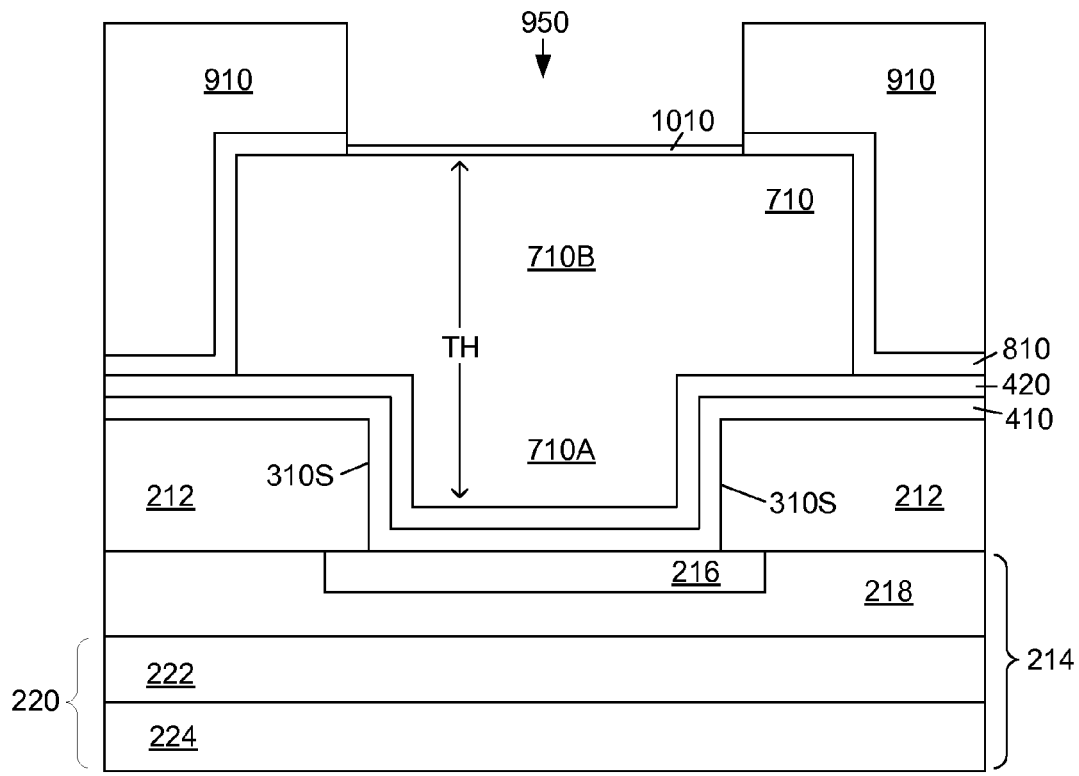
FIG. 16 shows a structure in accordance with an embodiment of the present invention.

Referring to FIG. 15, the layer 214 may include two or more layers (e.g. a stack of layers). For example, the layer 214 may include (or may consist essentially of) a layer dielectric layer 218 overlying a layer 220. A metal line 216 is embedded within the dielectric layer 218. The dielectric layer 218 may represent an inter-level dielectric layer and the metal line may represent the metal line of a metallization level. The metallization level may, for example, be metal-1 so that layer 220 may represent a substrate (e.g. a semiconductor substrate). However, the metallization level of metal line 216 may present a level above metal-1. In such as case, as shown in FIG. 16, the layer 220 may include a layer 222 overlying a layer 224. In such a case, the layer 222 may represent additional metallization levels and inter-level dielectric layers while the layer 220 may include (or may be) a substrate (such as a semiconductor substrate). In one or more embodiments, the metal line 216 may represent a final metal line of a final metallization level. In this case, the portion 710B may still represent a metal line. Likewise, the portion 710A may still represent a conductive via. It is understood that a metal line may include a metal pad.

As noted, the layer 222 may include one or more metallization levels. The metal line 216 may be part of a metallization level of the semiconductor chip. In one or more embodiments, the portion 710A may represent a conductive via which electrically couples the metal line 710B (belonging to an upper metallization level to the metal line 216 (belonging to a lower metallization level). It is noted that a metal line may itself include a pad structure (e.g. a bonding pad, a contact pad and/or a landing pad).

It is noted that in some embodiments, a metal line may be particularly useful in routing electrical signals primarily in a horizontal direction. It is further noted that in some embodiments, a conductive via may be particularly useful in routing electrical signals primarily in a vertical direction.

Still referring to FIG. 16, in some embodiments, the metal line 216 may be a final metal line belonging to a final or top metallization level. The dielectric layer 212 may, in some embodiments, represent a passivation layer for a semiconductor chip or integrated circuit. The fill layer 710 may represent a bond pad. The bond pad 710 may be disposed above the final metallization level and may overlie the final metal line 216 of a final metallization level of a semiconductor chip and/or integrated circuit. A bond pad 710 may include a lower portion 710A of the fill layer 710 formed through the passivation layer 212 and an upper portion 710B of fill layer 710 formed over the portion 710A so as to provide additional strength and reinforcement. The bond pad 710 may be used for wiring bonding or for probing purposes.

Hence, a wire bond may be electrically coupled to the bond pad 710 through the opening 950. The passivation layer 1010 may help to protect the bond pad 950 from the formation of unwanted oxides. For example, when the bond pad 710 comprises copper metal and/or a copper alloy, the passivation layer 1010 may help to prevent the formation of unwanted copper oxide.

As noted, the metal line 216 may itself include a pad structure. The pad structure may be a relatively wider portion than a remaining portion of the metal line. The bond pad portion of metal line 220 may underlie the bond pad 710.

Referring once again, to FIG. 2, in the embodiment shown, it is seen that, in one or more embodiments, an opening 310 may be formed in the workpiece 210 prior to the formation of the barrier layer 410 or the seed layer 420. However, in one or more embodiments, the opening 310 need not be formed. This is illustration in the process shown in FIGS. 17 through 21.

Figure 17:
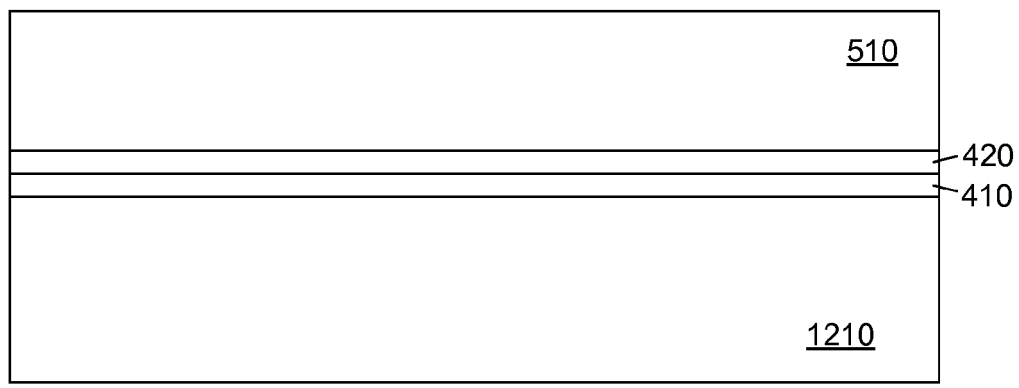
FIGS. 17 through 23 show a method of forming a structure in accordance with an embodiment of the present invention.

FIG. 17 shows a workpiece 1210. The workpiece 1210 may be any workpiece. It is understood that, in some embodiments, the workpiece 1210 may not be the same as workpiece 210 shown in FIG. 1. In one or more embodiments, the workpiece 1210 may, for example, correspond to the layer 214 shown in FIG. 2B. In one or more embodiments, the workpiece 1210 may, for example, correspond to the workpiece 210 shown in FIG. 1. In some embodiments, the workpiece 1210 may have a substantially planar top surface 1210T. The workpiece 1210 may be a single homogeneous layer or in may include a plurality of layers. The workpiece 1210 may include conductive, semiconductive and/or dielectric materials.

A barrier layer 410 (as described above) may be formed over the workpiece 1210. A seed layer 420 (as described above) may be formed over the barrier layer 410. A masking layer 510 may be formed over the seed layer 420. In one or more embodiments, the masking layer 510 may be a photoresist layer.

Figure 18:
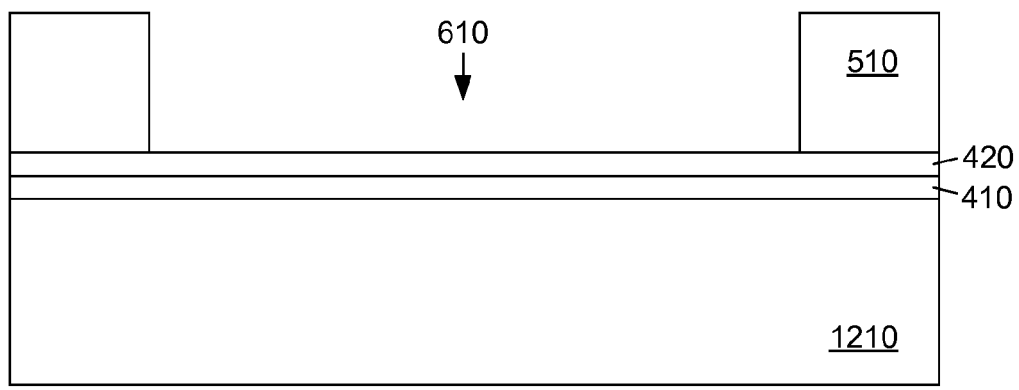
Figure 19:
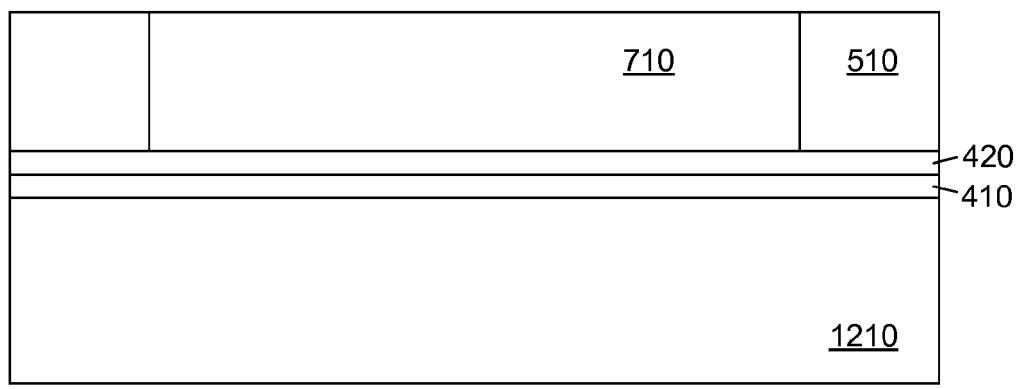

Referring to FIG. 18, an opening 610 may formed through the masking layer 510 so as to expose the seed layer 420. Referring to FIG. 19, a fill layer 710 may be formed over the seed layer within the opening 610. The fill layer 710 may be formed by an electroplating process onto the seed layer 420.

Figure 20:
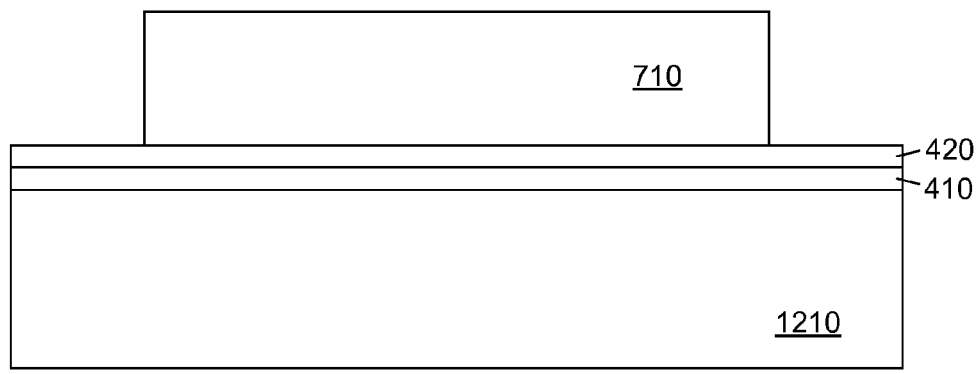
Figure 21:
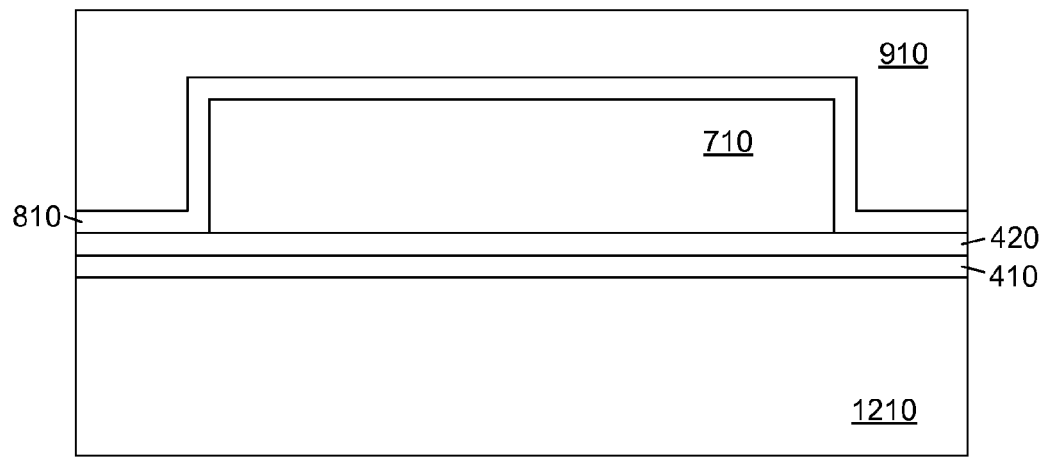

Referring to FIG. 20, the masking layer 510 is removed. Referring to FIG. 21, a second barrier layer 810 may be formed over the fill layer 710. A dielectric layer 910 may be formed over the barrier layer 810.

Figure 22:
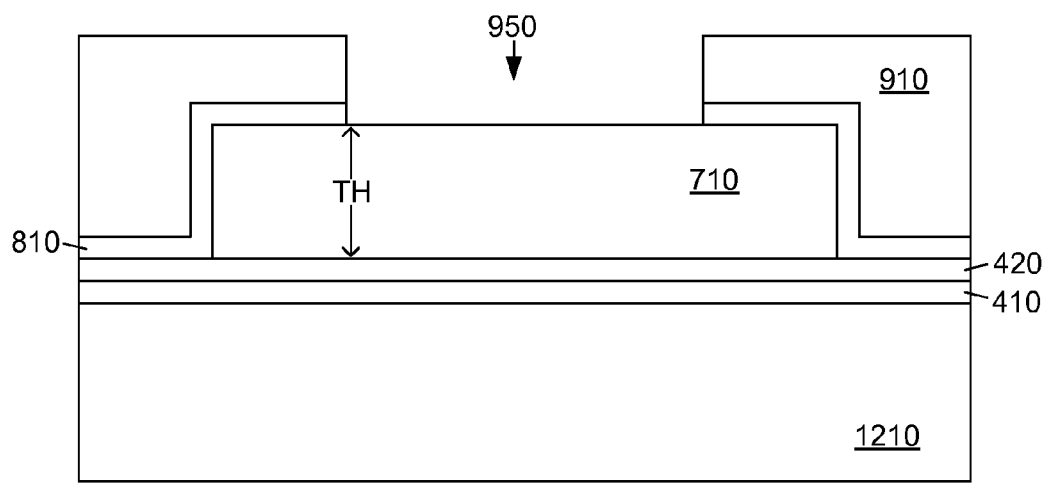

Referring to FIG. 22 an opening 950 is formed through the dielectric layer 910 and through the barrier layer 810 so as to expose the fill layer 710. FIG. 21 shows the formation of the passivation layer 1010 after the anneal process, as explained above.

Referring again to FIG. 22, in one or more embodiments, the fill layer 710 may have a thickness TH of at least about 2 microns (W. In one or more embodiments, the fill layer 710 may have a thickness of at least about 2.5 microns. In one or more embodiments, the fill layer 710 may have a thickness of at least about 3 microns. In one or more embodiments, the fill layer 710 may have a thickness of at least about 3.5 microns. In one or more embodiments, the fill layer 710 may have a thickness of at least about 4 microns. In one or more embodiments, the fill layer 710 may have a thickness of at least about 4.5 microns. In one or more embodiments, the fill layer 710 may have a thickness of at least about 5 microns.

Figure 23:
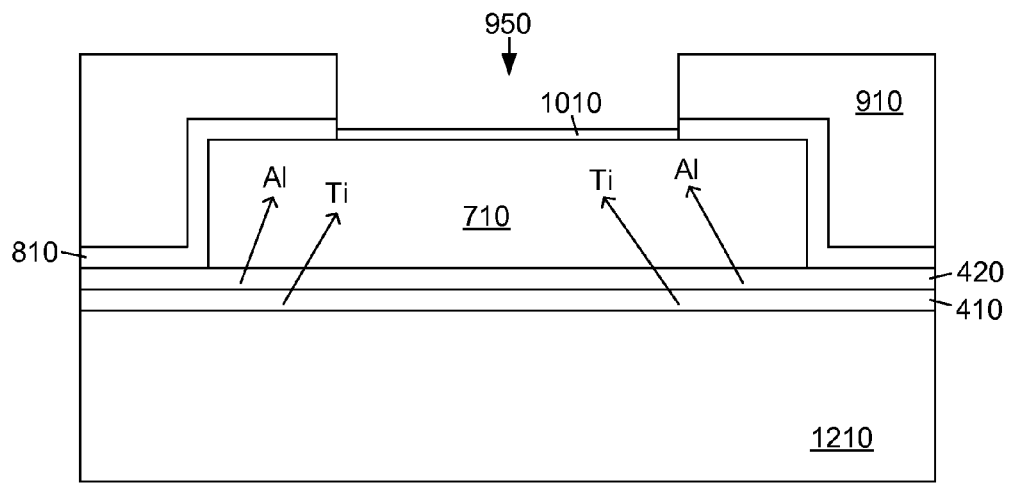

Referring to FIG. 23, a passivation layer 1010 (as explained above) may be formed. As explained above, the passivation layer 1010 may be formed as a result of an anneal process. The anneal process may cause the diffusion of Ti (titanium) and/or Al (aluminum) (or other additional elements as described above) to the top surface of the fill layer 710.

Referring to FIG. 23, the layer 710 may also represent a bonding pad or some other conductive feature such as a metal line, conductive via, etc. The semiconductor structure show in FIG. 23 may represent a semiconductor device and/or a semiconductor chip and/or an integrated circuit.

Referring to FIG. 23, it is possible that workpiece 1210 represent a substrate (such as a semiconductor conductive). However, it is possible that workpiece 1210 may include a plurality of layers. For example, referring to FIG. 24, workpiece 1210 may include a dielectric layer 218 over a layer 220 where the layer 218 represents an inter-level dielectric layer. In some embodiments, a metal line 216 may be embedded within the dielectric layer 218. The metal line 216 may be part of a metallization level such as metal-1, metal-2, metal-3, all the way to the final or top metallization level.

Figure 24:
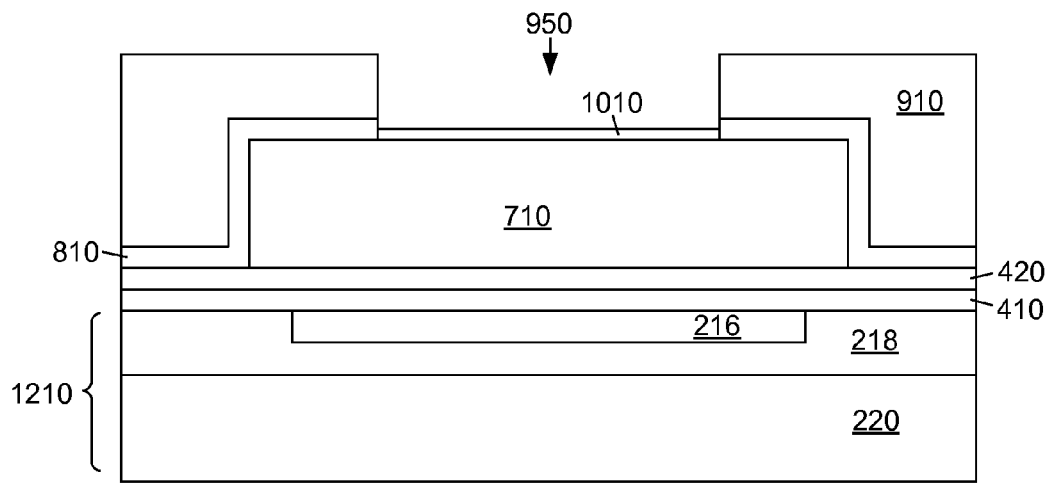
FIG. 24 shows a structure in accordance with an embodiment of the present invention.

The layer 220 shown in FIG. 24 may, for example, represent a substrate (e.g. a semiconductor substrate). However, referring to FIG. 25, it is also possible that the layer 220 include a layer 222 over a layer 224. In this case, it is possible that layer 222 represent one or more inter-level dielectric layers as well as one or more metallization levels. In this case, it is possible that layer 224 represent a substrate, such as a semiconductor substrate.

Figure 25:
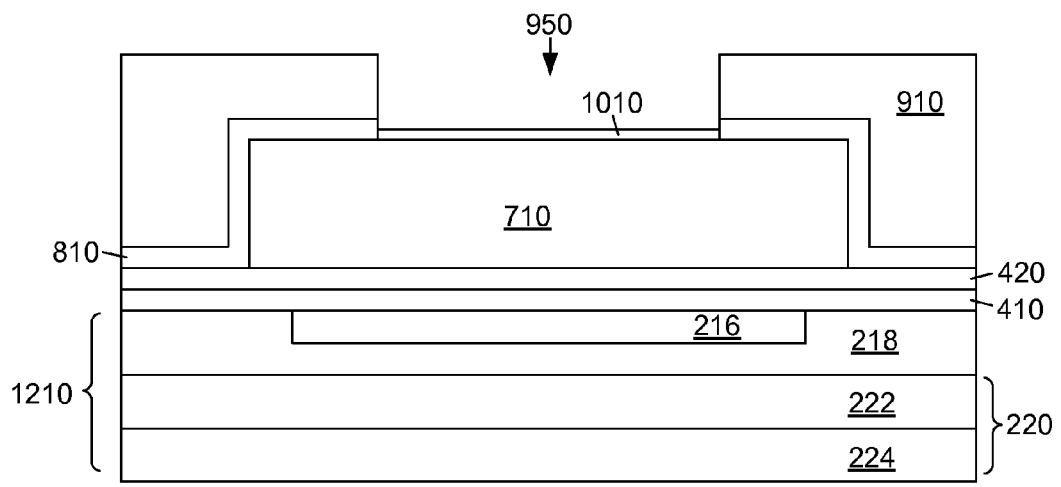
FIG. 25 shows a structure in accordance with an embodiment of the present invention.

It is noted that the metal line 216 shown in FIGS. 13, 14 and again in FIGS. 24, 25 may comprise a conductive material such as a metallic material. Examples of materials include copper metal, copper alloy, aluminum metal and aluminum alloy. Other materials are also possible.

In some embodiments, the use of a combination of a barrier layer that includes Ti (titanium) (which may be in the form of titanium metal) as well as a seed layer that includes Al (aluminum) (which may, for example, be in the form of a metallic alloy such as a copper-aluminum alloy) may provide synergistic and unexpected results that may bring both Ti (titanium) and aluminum (Al) to the top surface of the fill layer.

While not wishing to be bound by theory, it may be possible that the use of a barrier layer that includes Ti (titanium) (which may, for example, be in the form of tantalum metal), as well as a seed layer that in includes Al (aluminum) (which may, for example, be in the form of a copper-aluminum alloy), may provide a synergistic effect in that that Ti (titanium) may help bring the Al (aluminum) to the top surface of the fill layer and the Al (aluminum) may help bring the Ti (titanium) to the top surface of the fill layer.

As noted above, one or more other additional elements may be used in additional to the Al or instead of the Al.

Illustrative Example

A) Using a 20 nm thick barrier layer of titanium metal, a 100 nm thick seed layer of copper-aluminum alloy (with about 2 atomic percent Al (aluminum)) and a 3 micron thick fill layer of copper metal. Annealing at about 380° C. for about 60 minutes forms both Ti (titanium) and Al (aluminum) to the top surface of the fill layer.

B) Using a 25 nm thick barrier layer of tantalum metal, a 100 nm thick seed layer of copper-aluminum alloy (with about 2 atomic percent Al (aluminum)) and a 3 micron thick copper metal fill layer. Annealing at about 380° C. for about 60 minutes does not bring Al (aluminum) to the top surface of the fill layer.

C) Using a 40 nm thick barrier layer of titanium metal, a 50 nm thick seed layer of copper metal and a 3 micron thick fill layer of copper metal. Annealing at about 380° C. for about 60 minutes does not bring the Ti (titanium) to the top surface of the fill layer.

One or more embodiments relate to a method of forming a semiconductor device, comprising: forming a structure, the structure including at least a first element and a second element; and forming a passivation layer over the structure, the passivation layer including at least the first element and the second element, the first element and the second element of the passivation layer coming from the structure. In one or more embodiments, forming the structure may comprise: providing a workpiece; forming a barrier layer over the workpiece; forming a seed layer over the barrier layer; and forming a fill layer over the seed layer.

One or more embodiments relate to a method of forming a semiconductor structure, comprising: providing a workpiece; forming a barrier layer over the workpiece, the barrier layer including Ti (titanium); forming a seed layer over the barrier layer, the seed layer comprising Cu (copper) and an additional element; and forming a fill layer over the seed layer, the fill layer including Cu (copper).

One or more embodiments relate to a semiconductor structure, comprising: a workpiece; a barrier layer overlying the workpiece, the barrier layer including a first element; a seed layer overlying the barrier layer, the seed layer including a metallic alloy, the metallic alloy including Cu (copper) and a second element; and a fill layer overlying the seed layer, the fill layer comprising Cu (copper).

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of forming a semiconductor device, comprising:
   forming a barrier layer over a workpiece, said barrier layer including a first metallic element;
   forming a seed layer over said barrier layer, said seed layer including a second metallic element;
   forming a fill layer over said seed layer; and
   forming a passivation layer over said fill layer, said passivation layer including at least said first metallic element and said second metallic element.

2. The method of claim 1 wherein said first metallic element and said second metallic element are selected from the group consisting of Al (aluminum), Mg (magnesium), Mn (manganese), V (vanadium), Cr (chromium), Sn (tin), Zn (zinc), and Ti (titanium).

3. The method of claim 1, wherein first metallic element is Ti (titanium) and said second metallic element is Al (aluminum).

4. The method of claim 1, wherein said seed layer and/or said fill layer comprises the element Cu (copper).

5. The method of claim 1, wherein said seed layer comprises a metallic alloy, said alloy includes the element Cu (copper) and said second metallic element.

6. The method of claim 1, wherein said workpiece includes an opening, said barrier layer formed within said opening.

7. The method of claim 1, wherein said first metallic element is Ti (titanium).

8. The method of claim 1, wherein said second metallic element is Al (aluminum).

9. The method of claim 1, wherein said first metallic element is Ti (titanium) and said second metallic element is Al (aluminum).

10. The method of claim 1, wherein the atomic percentage of said second metallic element in said seed layer is more than 0.1%.

11. The method of claim 1, wherein forming said passivation layer comprises an anneal process.

12. A method of forming a semiconductor structure, comprising:
    providing a workpiece;
    forming a barrier layer over said workpiece, said barrier layer including the element Ti (titanium);
    forming a seed layer over said barrier layer, said seed layer comprising the element Cu (copper) and an additional metallic element;
    forming a fill layer over said seed layer, said fill layer including the element Cu (copper); and
    forming a passivation layer over said fill layer, said passivation layer including said element Ti (titanium) and said additional metallic element.

13. The method of claim 12, wherein said passivation layer includes at least one oxide and/or at least one nitride.

14. The method of claim 12, wherein
    said element Ti (titanium) of said barrier layer is in the form of titanium metal and/or a titanium-tungsten alloy.

15. The method of claim 12, wherein said additional metallic element is an element selected from the group consisting of Al (aluminum), Mg (magnesium), Mn (manganese), V (vanadium), Cr (chromium), Sn (tin), and Zn (zinc).

16. The method of claim 15, wherein said additional element is Al (aluminum).

17. The method of claim 12, wherein
    said seed layer comprises a metallic alloy, said alloy including said element Cu (copper) and said additional element.

18. The method of claim 17, wherein the atomic percentage of said Cu is at least 95%.

19. The method of claim 12, wherein said workpiece includes an opening, said barrier layer formed within said opening.

20. The method of claim 12, wherein said fill layer comprises copper metal and/or copper alloy.

21. The method of claim 11, wherein said anneal causes the movement of said first metallic element from said barrier layer and said second metallic element from said seed layer to form said passivation layer.

22. The method of claim 12, wherein the atomic percentage of said additional metallic element in said seed layer is more than 0.1%.

* * * * *